(12) United States Patent
Lang et al.

(10) Patent No.: US 11,054,338 B2
(45) Date of Patent: Jul. 6, 2021

(54) CONDITION MONITORING

(71) Applicant: Aktiebolaget SKF, Gothenburg (SE)

(72) Inventors: Defeng Lang, Delft (NL); Hendrik Anne Mol, Sleeuwijk (NL); Florin Tatar, Delft (NL)

(73) Assignee: Aktiebolaget SKF, Gothenburg (SE)

( * ) Notice: Subject to any disclaimer, the term of this patent is extended or adjusted under 35 U.S.C. 154(b) by 172 days.

(21) Appl. No.: 16/375,960

(22) Filed: Apr. 5, 2019

(65) Prior Publication Data

US 2019/0310163 A1 Oct. 10, 2019

(51) Int. Cl.
*G01R 27/26* (2006.01)
*G01M 13/04* (2019.01)
*F16C 19/52* (2006.01)
*F16C 41/00* (2006.01)
*F16C 33/46* (2006.01)
*F16C 33/38* (2006.01)

(52) U.S. Cl.
CPC ........... *G01M 13/04* (2013.01); *F16C 19/525* (2013.01); *F16C 33/38* (2013.01); *F16C 33/46* (2013.01); *F16C 41/002* (2013.01); *G01R 27/2611* (2013.01); *F16C 2208/60* (2013.01); *F16C 2233/00* (2013.01)

(58) Field of Classification Search
CPC ...... F16C 33/46; F16C 2208/60; F16C 33/38; F16C 2233/00; F16C 19/525; F16C 41/002; G01M 13/00; G01M 13/04; G01R 27/2611
See application file for complete search history.

(56) References Cited

U.S. PATENT DOCUMENTS

| | | | | |
|---|---|---|---|---|
| 4,247,601 A * | 1/1981 | Wiegand | ............... | H01F 1/0304 148/121 |
| 4,253,443 A * | 3/1981 | Seeger | .................. | F02P 7/0672 123/609 |
| 4,309,628 A * | 1/1982 | Wiegand | ............... | F02P 7/0672 307/419 |
| 7,439,734 B2 * | 10/2008 | Fischer | ................ | G01D 5/2451 324/207.2 |

* cited by examiner

*Primary Examiner* — Vinh P Nguyen
(74) *Attorney, Agent, or Firm* — Garcia-Zamor Intellectual Property Law; Ruy Garcia-Zamor; Bryan Peckjian

(57) ABSTRACT

Condition monitoring a cage to detect cage damage by detecting if a conducting material applied to a cage is unbroken or broken. The basic principle of the invention is to integrate a completely passive LC circuit, having the conducting material, on the cage. The LC circuit is magnetically activated and it is externally detectable when conducting material is unbroken or broken. The conducting material of the passive LC circuit is easily broken or worn, being weaker than the cage material. The cage material is non-metallic, such as a polymer material or other suitable synthetic materials.

10 Claims, 2 Drawing Sheets

CONDITION MONITORING

CROSS-REFERENCE

This application claims priority to European patent application no. 18166481.4 filed on Apr. 10, 2018, the contents of which are fully incorporated herein by reference.

TECHNOLOGICAL FIELD

The invention concerns condition monitoring of rotating equipment such as rolling element bearings, and is more particularly directed to condition monitoring of rolling element bearings with cages and cages as such.

BACKGROUND

Condition monitoring of rotating equipment/machines such as shafts, roller and plain bearings, and gears, is commonly done with one or more sensors measuring one or more physical parameters and transduce these physical parameters into electrical signals, which can then be processed to try and determine the condition of the equipment/machine as a whole and/or of the individual parts. The one or more physical parameters usually comprises temperature. It is known to provide bearings such as ball bearings or roller bearings with temperature sensors. For monitoring the condition of a bearing, heat generated at the interface of balls/rollers and the raceways is suitably detected by a temperature sensor located as close as possible to this interface. This makes a traditional metal cage of a bearing a desirable position for temperature measurement. However, there is a move towards using non-metallic cages for several reasons such as cost, weight, and reliability. A non-metallic cage has a different failure process than a metallic cage. Frictional problems, which can cause serious wear, does not cause a general cage temperature rise in a non-metallic bearing as it does in a metallic bearing, making it difficult to use a temperature sensor to monitor the condition of the cage and thus also the bearing. Train bearing units or train axle-boxes of high-speed trains are being equipped with polyamide cages. These train bearing units are sometimes monitored using hot-box infrared scanners arranged alongside the track. These infrared scanners detect increased temperature in bearing components to detect defective bearings. While the polyamide cages have turned out to be safer than formerly used steel cages, defects and/or damages in polyamide cages will not be detectable using the hot-box infrared scanners. A damaged cage could cause a total bearing failure if it breaks apart, this without any detectable temperature increase, by for example a hot-box infrared scanner. The detection of cage failure is also beneficial in aerospace and many other applications, especially high speed bearing applications.

There are many difficulties in adding one or more sensors to a bearing cage. A bearing cage is rotating, cannot be easily accessed, and the available space is very small. In particular for smaller bearings, it is difficult or impossible to integrate batteries or a generator into or onto a bearing cage. And if temperature measurements, local or remotely, is not a good option to at least indirectly monitoring the condition, the integrity, of non-metallic cages, then what is? There seems to be room for improvements.

SUMMARY

An object of the invention is to define a non-metallic cage condition monitoring method, device and a cage therefore with simplified possibility to detect cage damage.

The aforementioned object is achieved by detecting if a conducting material applied to a cage is unbroken or broken. The basic principle of the invention is to integrate a completely passive LC circuit, comprising the conductive material, on the cage. The LC circuit is magnetically activated and it is externally detectable when conducting material is unbroken or broken. The conducting material of the passive LC circuit is easily broken or worn, being weaker than the cage material. The cage material is non-metallic, such as a polymer material or other suitable synthetic materials.

The aforementioned object is also achieved by a method of condition monitoring a bearing cage by determining if the cage has a positive or negative status. The cage has a cage body with pockets for rolling elements. According to the invention the method further comprises a number of steps. In a first step providing the cage with a Wiegand wire. In a second step further providing the cage with an electrical loop comprising a pulse coil, a capacitor, and a conducting track. In a third step magnetizing and triggering a Wiegand wire by subjecting the Wiegand wire to two magnetic fields of opposite polarity, creating voltage pulses in the pulse coil. In a fourth step measuring and determining if there is an emission of electromagnetic radiation emitted by an LC resonant circuit created by the electrical loop. In a fifth step determining if the electrical loop is intact or broken. And in a sixth step providing a positive status of the cage if it is determined that the electrical loop is intact and providing a negative status of the cage if it is determined that the loop is broken.

Preferably the cage body is made from a nonmetallic material. The method advantageously also comprises the step of at least in part embedding the conducting track in the cage body and/or at least in part onto the cage body. In some versions of the method further comprises the step of at least in part embedding the conducting track under surfaces of the cage that are subjected to wear, in some of those versions of the method the step further comprises embedding the conducting track to a depth that is equal to a depth bordering on an acceptable wear. The intention is that the conducting track will break when the wear reaches the limit of what is considered acceptable wear for the cage.

The different additional enhancements of the condition monitoring method according to the invention can be combined in any desired manner as long as no conflicting features are combined.

The aforementioned object is also achieved by a bearing cage arranged for condition monitoring of the bearing cage. The bearing cage comprises a cage body with a plurality of pockets for rolling elements of a bearing. According to the invention characterized in that the cage further comprises a Wiegand wire, a pulse coil and an electrical loop. The pulse coil is arranged such that it generates a voltage pulse when the magnetic field of the Wiegand wire changes. The electrical loop comprises the pulse coil, a capacitor and a conducting track, suitably connected in series. The electrical loop is arranged to create an LC resonant circuit with the pulse coil and the conducting track creating and providing the inductance, L, and the capacitor the capacitance, C.

Suitably the capacitance is changed/adjusted for a desired resonant frequency. Advantageously the cage body is made from a nonmetallic material. In some embodiments of the cage the conducting track is at least in part embedded into the cage body. In other embodiments the conducting track is at least in part embedded under surfaces of the cage body subjected to wear to a depth that is equal to a depth bordering on an acceptable wear level.

The different additional enhancements of the cage according to the invention can be combined in any desired manner as long as no conflicting features are combined.

The aforementioned object is also achieved by a condition monitoring device arranged to monitor the condition of a bearing cage by determining if the cage has a positive or negative status. The device comprises a bearing cage according to any embodiment described above. According to the invention the device further comprises a processing unit, a reception coil and at least two permanent magnets. The reception coil is connected to the processing unit. The reception coil is arranged in proximity to the cage when in use, suitably on or embedded in a seal of the bearing of the cage. The two permanent magnets are arranged such that when the device is in use and the cage rotates, the Wiegand wire is alternatively subjected to a negative magnetic field and a positive magnetic field. Suitably the magnets are attached to or embedded in a seal of the bearing the cage is mounted into.

The processing unit determines that the cage has a positive status as long as it also determines that the reception coil captures electromagnetic radiation emitted by the LC resonant circuit when the cage is rotating. The LC resonant circuit will work as long as the electrical loop is intact, indicating that the cage has not lost its integrity. The processing unit determines that the cage has a negative status as long as it also determines that the reception coil does not capture electromagnetic radiation emitted by the LC resonant circuit when the cage is rotating. It indicates that the electrical loop is broken, that is the conducting track is not intact, this indicates that the cage is broken or worn out.

The different additional enhancements of the condition monitoring device according to the invention can be combined in any desired manner as long as no conflicting features are combined.

Other advantages of this invention will become apparent from the detailed description.

BRIEF DESCRIPTION OF THE DRAWINGS

The invention will now be described in more detail for explanatory, and in no sense limiting, purposes, with reference to the following figures, in which.

DETAILED DESCRIPTION

In order to clarify the method and device according to the invention, some examples of its use will now be described in connection with FIGS. 1-3.

Figure 1:
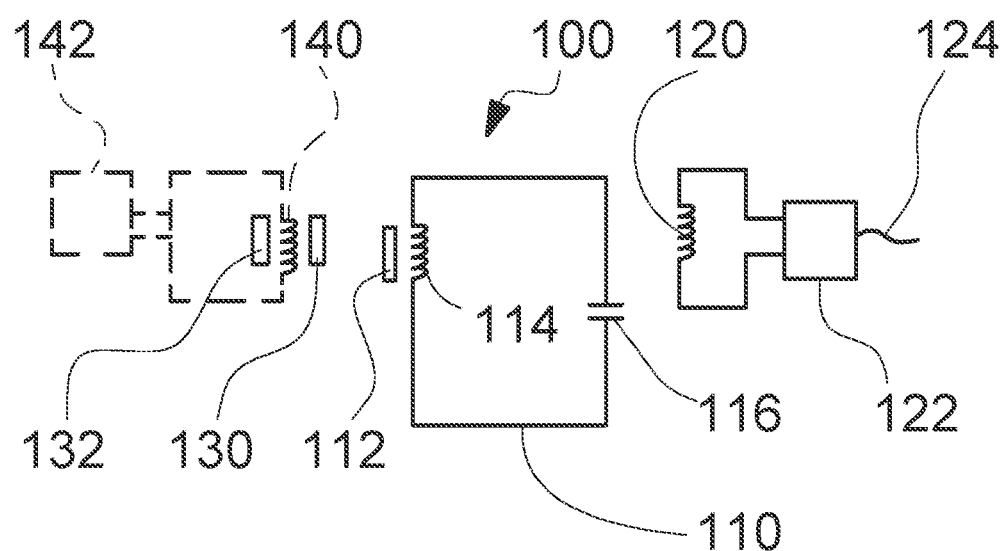
FIG. 1 illustrates a schematic diagram of the invention.

FIG. 1 illustrates a schematic diagram of the invention. It comprises a Wiegand wire 112 suitably surrounded by or at least proximate to an inductor coil 114, a capacitor 116 for the C of an LC resonant circuit, and monitoring wiring/conductive track 110, on a cage to be monitored. The inductor coil 114 together with the conductive track 110 looping around the cage, is in most applications sufficient for the inductance L of the LC circuit. For bearings located proximate to each other, it is suitable to have different resonating frequencies for the different cages so that it can be identified which is which. The capacitance of the capacitor 116 can be varied, the C of the LC circuit, or L of the LC circuit can be varied.

Not on the cage, but more or less in proximity to the cage there are at least two magnets 130, 132 for the activation of the Wiegand wire, a reception coil 120 for detecting the LC circuit activity, a processing unit 122 to determine the state of the cage, and a communication part 124 for indicating the status of the cage. The at least two permanent magnets 130, 132 can suitably be mounted in or on a seal of a bearing into which the cage is mounted. In some embodiments also the reception coil 120 and suitably also at least a part of the processing unit 122. If permanent magnets are used, then two are needed for each complete triggering point, and there can be more triggering points. In addition, an optional coil 140 placed in proximity of the at least two permanent magnets 130, 132, and an optional processing unit 142 can determine the presence of the Wiegand wire 112 and possibly provide a reference to the processing unit 122. Each time the Wiegand wire 112 is triggered by the permanent magnets 130, 132, the Wiegand wire create magnetic field pulses that can be picked up by the optional coil 140.

The Wiegand effect is used according to the invention to create voltage pulses to thereby enable the LC circuit to resonate. There are two modes of magnetic excitation of the Wiegand effect, symmetric switching and asymmetric switching. In symmetric switching, alternating positive and negative magnetic fields of equal strength are used to magnetize and trigger the Wiegand wire. In asymmetric switching, the Wiegand wire is magnetized and triggered by magnetic fields of opposite polarity with unequal strength. Suitably symmetric switching is used. The magnets can for example be permanent magnets or (an) electro magnet(s). If an electro magnet is used, then there can be two, one for each polarity, or only one electro magnet with a varying polarity, pulsed or continuous. For most embodiments according to the invention it is advantageous to use permanent magnets. Using permanent magnets, the two magnets 130, 132 has to be attached to something that is in relative movement in relation to the cage, such as a seal if one is available/present, when the bearing is rotating, such that the Wiegand wire 112 passes by first one of the magnets and then the other. This will each time the Wiegand wire 112 passes by the two magnets 130, 132, create two magnetic field pulses by the Wiegand wire 112 that in turn creates two voltage pulses in the inductor coil 114 that is placed around or near to the Wiegand wire 112.

The voltage pulses will make the LC circuit resonate as long as the complete circuit 114, 110, 116 is not broken. If the circuit is broken, due to wear through the conductive track, then the LC circuit will not resonate. The presence and absence of the resonating LC circuit can then be detected by the reception coil 120 and the processing unit 122. If it is detected that the LC circuit does not radiate any electromagnetic field for the reception coil 120, then the processing unit 122 will indicate this by the communication part 124. The communication part 124 can indicate the status of the cage by a light of green/red to indicate a positive or negative status, and/or communicate this by wire or wirelessly to other condition monitoring equipment for further processing.

Figure 2:
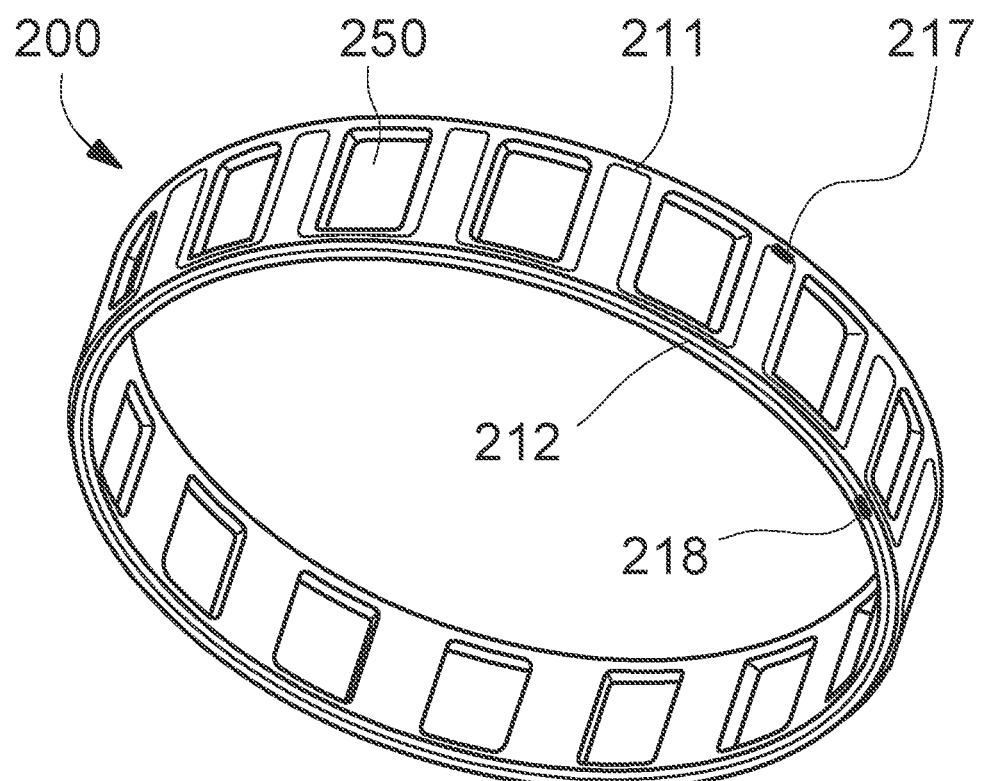
FIG. 2 illustrates a cage according to one embodiment of the invention.

FIG. 2 illustrates a cage 200 according to one embodiment of the invention. The illustrated cage 200 is for a rolling element bearing and has pockets 250 for rollers. The cage comprises a first conductive track 211 on a radially oriented surface of the cage, going around three sides of each pocket 250. The cage further comprises a second conductive track 212 on an axially oriented side face of the cage. The two conductive tracks 211, 212 form two separate loops in this embodiment, and therefore each has its own Wiegand wire, coil and capacitor 217, 218. An advantage of this is to be able to determine more closely where a fault lies and thereby be able to more accurately determine how urgent a replacement cage has to be fitted. The number of loops will also depend on the size of the cage, the geometrical locations of the critical places to monitor, and cost as more loops will require additional components. The width of the one or more conductive tracks 211, 212, should preferably not be wide but narrow and suitably be long and cover as much as possible of the surfaces of the cage by winding back and forth. If the tracks are wide then they will be more difficult to break and a cage will have broken down much more when a warning comes than in relation to using thin/narrow tracks which will break easier due to loss of cage integrity and/or wear.

The conductive tracks 211, 212 are suitably directly attached to the material of cage 200 and is designed so as to have a breaking point equal to or less than a breaking point of the cage material. The cage material may be polyamide, a polymer material or other suitable synthetic materials. In this context, the breaking point means in particular an elongation at fracture of the material. The cage material and the conductive track are chosen such that the conductive track when the cage material does so. This can be achieved, in particular, by using a thin conductive layer as the conductive track. At the same time, the adhesion of the conductive track to the surface of the cage shall be sufficiently strong to make sure that the conductive track layer ruptures rather than peels off when the strain becomes too large. This specific relation between the rupturing strength of the cage and the conductive track layer can be achieved, in particular, in embodiments where the conductive track is printed onto the cage material or where the conductive track is formed as a plating on the cage material. As illustrated the design of the conductive tracks are such that a rupture at any relevant section of the cage completely interrupts the conductive track connection at the point of the crack such that the conductive track loop is opened. A rupture of a conductive track at any location results in the passive LC resonant circuit losing its ability to resonate. This can be easily and reliably detected in order to determine that cage failure has occurred.

The conductive track can be placed on suitable places, flat or grooves, on the surface of the cage body, and/or be embedded into the cage material. Only on the surface, at least partially on the surface, at least partially embedded and only embedded. The parts of the conductive track that are on the surface can be added either by a very thin and fragile metal sheet or by printing, plating, painting, or coating the conductive layer forming the conductive track onto a surface of a first part of the cage. The structuring of the conductive track may further include etching. A protective coating layer may be added if desired/needed. When the conductive track is embedded into the cage material, either by over-molding a very thin and fragile metal sheet or by printing, painting, plating, or coating the conductive layer forming the conductive track onto a surface of a first part of the cage which would then be over-molded in a second molding step. The structuring of the conductive track may further include etching.

Advantageously the conductive track is embedded to a shallow depth that represents an unacceptable amount of cage wear. The conductive track is suitably embedded in a wear surface of the cage which, in operational use, is in moving contact with a further surface of a bearing that comprises the cage. Cage failure due to wear is thus detectable.

Figure 3:
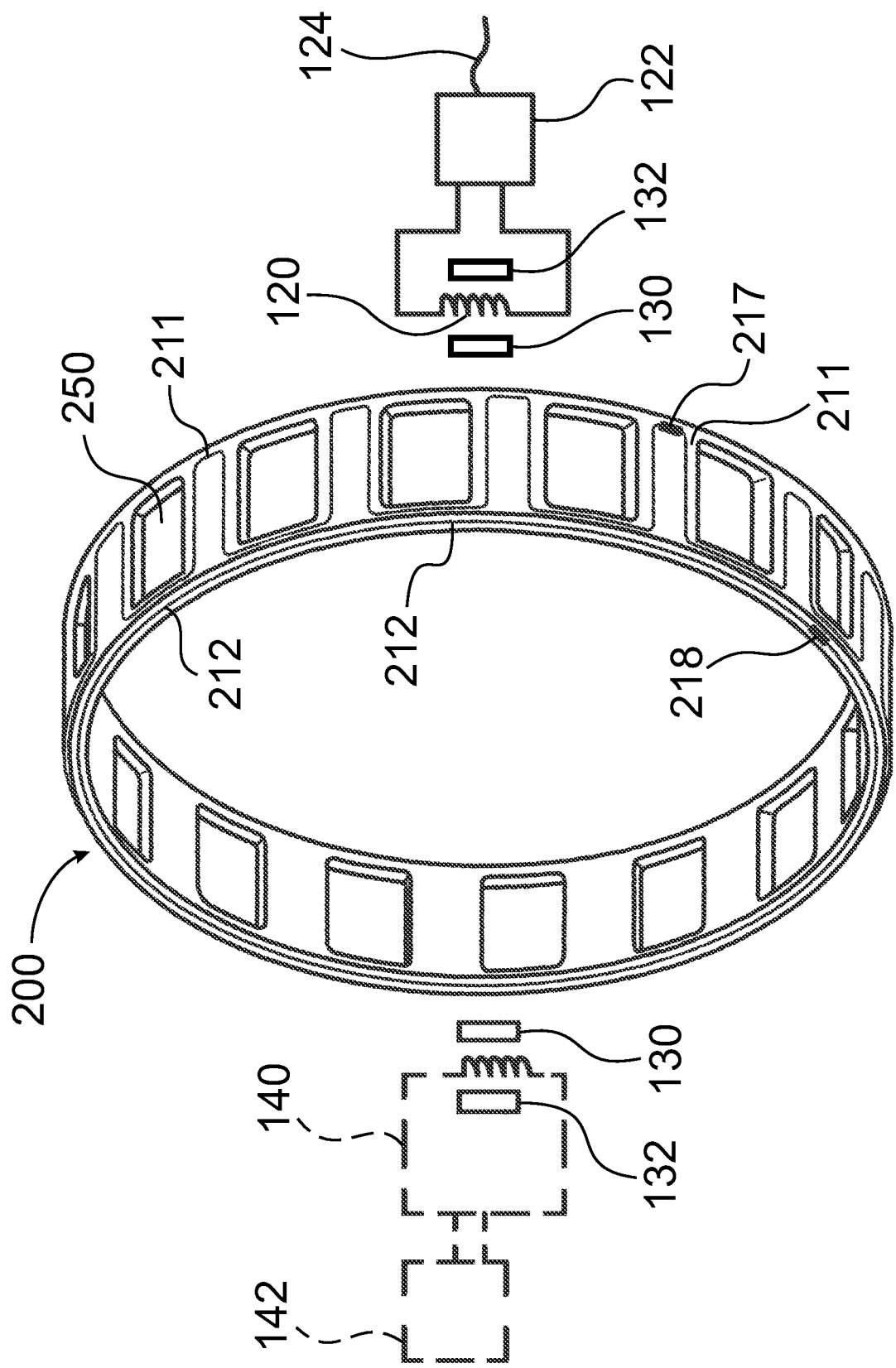
FIG. 3 illustrates the cage incorporated into the schematic diagram of FIG. 1 according to an embodiment of the invention.

FIG. 3 illustrates the invention on cage 200 to be monitored, according to one embodiment of the invention. The illustrated cage 200 is for a rolling element bearing and has pockets 250 for rollers. The cage comprises a first conductive track 211 on a radially oriented surface of the cage, going around three sides of each pocket 250. The cage further comprises a second conductive track 212 on an axially oriented side face of the cage. The two conductive tracks 211, 212 form two separate loops in this embodiment, and therefore each has its own Wiegand wire, coil and capacitor 217, 218. There are two magnets 130,132 in proximity to the cage 132 for the activation of the Wiegand wire, a reception coil 120 for detecting the LC circuit activity, a processing unit 122 to determine the state of the cage, and a communication part 124 for indicating the status of the cage.

In addition, the optional coil 140 is placed in proximity of an additional at least two permanent magnets 130, 132, and an optional processing unit 142 can determine the presence of the Wiegand wire 218 and possibly provide a reference to the processing unit 122. Each time the Wiegand wire 218 is triggered by the permanent magnets 130, 132, the Wiegand wire creates magnetic field pulses that can be picked up by the optional coil 140.

The invention is not restricted to the above-described embodiments but may be varied within the scope of the following claims.

FIG. 1 illustrates a schematic diagram of the invention in:
  100 Schematic wiring of a cage according to the invention,
  110 Cage monitoring wiring,
  112 Wiegand wire,
  114 Inductor coil around Weigand wire,
  116 Capacitor for LC circuit,
  120 Reception/receiver coil, mounted either on a seal, the outer ring, the inner ring or another part,
  122 Processing unit for any received signals through the reception coil,
  124 Communication of condition monitoring status of the cage,
  130 A first magnet generating a first magnetic field,
  132 A second magnet generating a second magnetic field of opposite polarity in relation first magnetic field,
  140 An optional coil to check the presence and functioning of the Wiegand wire,
  142 An optional processing unit for received signals from the optional coil, this can be a part of the processing unit.

FIG. 2 illustrates a cage according to one embodiment of the invention:
  200 A cage according to one embodiment of the invention,
  211 A first monitoring wire/conductor/conductive track around one or more, suitably all, pockets,
  212 A second monitoring wire/conductor/conductive track around one edge of the cage,
  217 Wiegand wire, coil and capacitor of the first monitoring wire,
  218 Wiegand wire, coil and capacitor of the second monitoring wire,
  250 Cage pockets for rollers of the rolling element bearing, FIG. 3 illustrates a cage according to one embodiment of the invention and the schematic wiring incorporated in the cage.

120 Reception/receiver coil, mounted either on a seal, the outer ring, the inner ring or another part,
122 Processing unit for any received signals through the reception coil,
124 Communication of condition monitoring status of the cage,
130 A first magnet generating a first magnetic field,
132 A second magnet generating a second magnetic field of opposite polarity in relation first magnetic field,
140 An optional coil to check the presence and functioning of the Wiegand wire,
142 An optional processing unit for received signals from the optional coil, this can be a part of the processing unit.
200 A cage according to one embodiment of the invention,
211 A first monitoring wire/conductor/conductive track around one or more, suitably all, pockets,
212 A second monitoring wire/conductor/conductive track around one edge of the cage,
217 Wiegand wire, coil and capacitor of the first monitoring wire,
218 Wiegand wire, coil and capacitor of the second monitoring wire,
250 Cage pockets for rollers of the rolling element bearing.

What is claimed is:

1. A method of condition monitoring a bearing cage by determining if the cage has a positive or negative status, the cage having a cage body with pockets for rolling elements, the method comprising the following steps: providing the cage with a Wiegand wire, providing the cage with an electrical loop comprising a pulse coil, a capacitor, and a conducting track, magnetizing and triggering a Wiegand wire by subjecting the Wiegand wire to two magnetic fields of opposite polarity, creating voltage pulses in the pulse coil, measuring and determining if there is an emission of electromagnetic radiation emitted by an LC resonant circuit created by the electrical loop, determining if the electrical loop is intact or broken, providing a positive status of the cage if it is determined that the electrical loop is intact, and providing a negative status of the cage if it is determined that the loop is broken.

2. The method of condition monitoring according to claim 1, wherein the cage body is made from a nonmetallic material.

3. The method of condition monitoring according to claim 1, further comprising the step of at least in part embedding the conducting track in the cage body and/or at least in part onto the cage body.

4. The method of condition monitoring according to claim 1, further comprising the step of at least in part embedding the conducting track under surfaces subjected to wear.

5. The method of condition monitoring according to claim 4, wherein the step of at least in part embedding the conducting track under surfaces subjected to wear further comprises embedding the conducting track to a depth that is equal to a depth bordering on an acceptable wear.

6. A bearing cage arranged for condition monitoring of the bearing cage, comprising: a cage body with a plurality of pockets for rolling elements of a bearing, wherein the cage further comprises: a Wiegand wire, a pulse coil arranged such that it generates a voltage pulse when the magnetic field of the Wiegand wire changes, an electrical loop comprising the pulse coil, a capacitor and a conducting track, the electrical loop is arranged to create an LC resonant circuit with the pulse coil and the conducting track creating providing the inductance, L, and the capacitor the capacitance, C.

7. The bearing cage according to claim 6, wherein the cage body is made from a nonmetallic material.

8. The bearing cage according to claim 6, wherein the conducting track is at least in part embedded in the cage body and/or the conducting track is at least in part placed on the cage body.

9. The bearing cage to claim 8, wherein the conducting track is at least in part embedded under surfaces of the cage subjected to wear to a depth that is equal to a depth bordering on an acceptable wear level.

10. A condition monitoring device arranged to monitor the condition of a bearing cage by determining if the cage has a positive or negative status, wherein the device comprises a bearing cage according to claim 6, wherein the device further comprises: a processing unit, a reception coil connected to the processing unit, the reception coil being arranged in proximity to the cage when in use, two permanent magnets arranged such that when the device is in use and the cage rotates the Wiegand wire is alternatively subjected to a negative magnetic field and a positive magnetic field, and the processing unit determines that the cage has a positive status as long as it also determines that the reception coil captures electromagnetic radiation emitted by the LC resonant circuit when the cage is rotating, and the processing unit determines that the cage has a negative status as long as it also determines that the reception coil does not capture electromagnetic radiation emitted by the LC resonant circuit when the cage is rotating.

* * * * *